United States Patent
Jones et al.

(10) Patent No.: US 7,278,580 B2
(45) Date of Patent: *Oct. 9, 2007

(54) IDENTIFICATION DOCUMENT WITH INTEGRATED CIRCUIT AND ANTENNA IN A LAYERED DOCUMENT STRUCTURE

(75) Inventors: Robert L. Jones, Andover, MA (US); Hannah J. Moore, Austin, TX (US)

(73) Assignee: Digimarc Corporation, Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/196,786

(22) Filed: Aug. 2, 2005

(65) Prior Publication Data

US 2006/0027667 A1 Feb. 9, 2006

Related U.S. Application Data

(63) Continuation of application No. 09/747,735, filed on Dec. 22, 2000, now Pat. No. 6,923,378.

(51) Int. Cl.
*G06K 7/10* (2006.01)
(52) U.S. Cl. .............. 235/488; 235/487; 235/492
(58) Field of Classification Search .............. 235/488, 235/487, 492, 380, 439, 472; 361/760, 782
See application file for complete search history.

(56) References Cited

U.S. PATENT DOCUMENTS

| | | | |
|---|---|---|---|
| 4,450,024 A | 5/1984 | Haghiri-Tehrani et al. |
| 4,506,148 A | 3/1985 | Berthold et al. |
| 4,617,216 A | 10/1986 | Haghiri-Tehrani et al. |
| 4,894,110 A | 1/1990 | Lass et al. |
| 4,990,759 A | 2/1991 | Gloton et al. |
| 5,013,900 A | 5/1991 | Hoppe |
| 5,171,625 A | 12/1992 | Newton |
| 5,173,840 A | 12/1992 | Kodai et al. |
| 5,208,450 A | 5/1993 | Uenishi et al. |
| 5,304,513 A | 4/1994 | Haghiri-Tehrani et al. |
| 5,334,573 A | 8/1994 | Schild |
| 5,380,695 A | 1/1995 | Chiang et al. |
| 5,534,372 A | 7/1996 | Koshizuka et al. |
| 5,579,694 A | 12/1996 | Mailloux |
| 5,681,356 A | 10/1997 | Barak et al. |
| 5,721,781 A | 2/1998 | Deo et al. |
| 5,763,868 A | 6/1998 | Kubota et al. |

(Continued)

FOREIGN PATENT DOCUMENTS

EP    991014    4/2000

(Continued)

OTHER PUBLICATIONS

EP 01992398.6 first examination report, dated Jan. 7, 2005.

(Continued)

*Primary Examiner*—Karl D. Frech

(57) ABSTRACT

An identification card is prepared by attaching an antenna and integrated circuit chip onto a core layer of polyolefin, attaching a bottom sheet to the core layer thus encasing the antenna and integrated circuit chip, providing an image-receiving layer on one or both outer surfaces of the resulting sandwich, and laminating a protective layer or layers over the image-receiving layer(s). The identification document displays improved durability, ease of manufacture and protection of the electronic components.

26 Claims, 2 Drawing Sheets

U.S. PATENT DOCUMENTS

| | | |
|---|---|---|
| 5,776,278 A | 7/1998 | Tuttle et al. |
| 5,783,024 A | 7/1998 | Forkert |
| 5,808,758 A | 9/1998 | Solmsdorf |
| 5,809,633 A | 9/1998 | Mundigl et al. |
| 5,861,662 A | 1/1999 | Candelore |
| 5,879,502 A | 3/1999 | Gustafson |
| 5,888,624 A | 3/1999 | Haghiri et al. |
| 5,892,661 A | 4/1999 | Stafford et al. |
| 5,953,710 A | 9/1999 | Fleming |
| 5,955,021 A | 9/1999 | Tiffany, III |
| 5,955,961 A | 9/1999 | Wallerstein |
| 5,962,840 A | 10/1999 | Haghiri-Tehrani et al. |
| 6,000,607 A | 12/1999 | Ohki et al. |
| 6,003,581 A | 12/1999 | Aihara |
| 6,007,660 A | 12/1999 | Forkert |
| 6,012,641 A | 1/2000 | Watada |
| 6,036,099 A | 3/2000 | Leighton |
| 6,047,888 A | 4/2000 | Dethloff |
| 6,049,463 A | 4/2000 | O'Malley et al. |
| 6,066,594 A | 5/2000 | Gunn et al. |
| 6,100,804 A | 8/2000 | Brady et al. |
| 6,111,506 A | 8/2000 | Yap et al. |
| 6,122,403 A | 9/2000 | Rhoads |
| 6,159,327 A | 12/2000 | Forkert |
| 6,160,526 A | 12/2000 | Hirai et al. |
| 6,199,144 B1 | 3/2001 | Arora et al. |
| 6,202,932 B1 | 3/2001 | Rapeli |
| 6,244,514 B1 | 6/2001 | Otto |
| 6,247,644 B1 | 6/2001 | Horne et al. |
| 6,250,554 B1 | 6/2001 | Leo et al. |
| 6,257,486 B1 | 7/2001 | Teicher et al. |
| 6,283,188 B1 | 9/2001 | Maynard et al. |
| 6,324,091 B1 | 11/2001 | Gryko et al. |
| 6,357,664 B1 | 3/2002 | Zercher |
| 6,390,375 B2 | 5/2002 | Kayanakis |
| 6,404,643 B1 | 6/2002 | Chung |
| 6,421,013 B1 | 7/2002 | Chung |
| 6,424,029 B1 | 7/2002 | Giesler |
| 6,478,228 B1 | 11/2002 | Ikefuji et al. |
| 6,482,495 B1 | 11/2002 | Kohama et al. |
| 6,485,319 B2 | 11/2002 | Bricaud et al. |
| 6,581,839 B1 | 6/2003 | Lasch et al. |
| 6,614,914 B1 | 9/2003 | Rhoads et al. |
| 6,638,635 B2 | 10/2003 | Hattori et al. |
| 6,764,014 B2 | 7/2004 | Lasch et al. |
| 6,803,114 B1 | 10/2004 | Vere et al. |
| 6,843,422 B2 | 1/2005 | Jones et al. |
| 6,900,767 B2 | 5/2005 | Hattori |
| 6,923,378 B2 * | 8/2005 | Jones et al. .................. 235/488 |
| 7,199,456 B2 | 4/2007 | Krappe et al. |
| 2001/0002035 A1 | 5/2001 | Kayanakis |
| 2002/0070280 A1 | 6/2002 | Ikefuji et al. |
| 2003/0038174 A1 | 2/2003 | Jones |
| 2005/0072849 A1 | 4/2005 | Jones |

FOREIGN PATENT DOCUMENTS

| | | |
|---|---|---|
| EP | 0991014 | 4/2000 |
| EP | 1035503 | 9/2000 |
| EP | 1035503 | 6/2001 |
| JP | 11259620 | 9/1999 |
| WO | WO 99/24934 | 5/1999 |
| WO | WO9924934 | 5/1999 |
| WO | WO 02/053499 | 7/2002 |
| WO | WO 03/005291 | 1/2003 |

OTHER PUBLICATIONS

EP 01992398.6 response to first examination report, dated Jul. 18, 2005.
EP 01992398.6 notice of grant, dated Nov. 28, 2005.
WO02/052499 search report, dated Aug. 30, 2002.
WO02/052499 Written Opinion, dated Mar. 18, 2004.
U.S. Appl. No. 10/836,639, Bi et al., filed Apr. 29, 2004.
Final Rejection, U.S. Appl. No. 10/836,639, Bi et al., filed Apr. 29, 2004.
W. Rankl and W. Effing, "Smart Card Hand Book" 1997, John Wiley & Sons, pp. 35-40.
PCT -- Notification of Transmittal of the International Search Report or the Declaration, for International Application No. PCT/US02/41320, mailed on Jul. 28, 2003.
PCT -- International Search Report for International Application No. PCT/US02/41320, mailed on Jul. 28, 2003.

* cited by examiner

IDENTIFICATION DOCUMENT WITH INTEGRATED CIRCUIT AND ANTENNA IN A LAYERED DOCUMENT STRUCTURE

Related Application Data

This application is a continuation of U.S. patent application Ser. 09/747,735, filed Dec. 22, 2000 (now U.S. Pat. No. 6,923,378), which is hereby incorporated by reference.

BACKGROUND OF THE INVENTION

This invention relates to an improved identification card. More specifically, this invention relates to an identification card containing an internal antenna and integrated circuit chip laminated between two protective, non-rigid layers onto which artwork may be printed, which are then laminated between to rigid outer layers.

"Smart cards" which contain an IC chip are well known in the art and typically have been used for credit card and ATM transactions. Smart cards may either have contacts on their surface to interface with a card reader or they may be contactless cards and incorporate an antenna within the body of the card to transfer data without physical contact with a reading device.

Typically smart cards have been made with a rigid core onto which an IC chip and antenna are positioned by means of glue or a mechanical device. The rigid core is then covered with a plastic, encasing the structure in a polymer. For example, U.S. Pat. No. 5,809,633 issued to Mundigl, et al. discloses a method whereby an antenna is inserted into a recess in a carrier body. U.S. Pat. No. 5,955,021 issued to Tiffany, III teaches the use of low shrinkage glue to secure the electronic components to a rigid plastic core layer, which is then placed into a bottom mold assembly. A top mold assembly is then attached to the bottom mold creating a void. Thermoplastic is then injected into the void space to secure the electronic components. Similarly, U.S. Pat. No. 6,049,463 issued to O'Malley, et al. discloses a microelectric assembly including an antenna embedded within a polymeric card by means of a mold assembly. The antenna and chip are placed into a mold and polymeric material is injected into the mold thus encasing the components.

U.S. Pat. No. 6,036,099 issued to Leighton discloses a process for manufacturing a combination contact/contactless smart card via a lamination process utilizing core sheets made from polyvinyl chloride (PVC), polyester, or acrylonitrile-butadiene-styrene (ABS). In the Leighton method, a region of the card is milled to expose the contacts of the card.

Due to the rigidity of the components used in the prior art cards, the electronic components cards can be subject to damage from bending stresses. Also, securing the antenna and chip with glue or a mechanical means is complicated and can needlessly increase the costs of production. Understandably, processes utilizing molds involve increased costs of tooling and production not seen in a lamination process. Both the highly plasticized poly(vinyl chloride) type and the polyester/poly(vinyl chloride) composite type can become brittle over time because of migration of the plasticizers, thus reducing the resistance of the document to cracking; such cracking renders the card unusable and vulnerable to tampering. Data that are crucial to the identification of the bearer are often covertly repeated on the document in encrypted form for data verification in a magnetic stripe, bar code, radio frequency module or integrated circuit chip. The inability to retrieve such data due to cracking renders the document invalid. In addition, many of the polyester/poly (vinyl chloride) composite documents have exhibited extreme sensitivity to combinations of heat and humidity, as evidenced by delaminating and curling of the document structure.

Therefore, a need exists for a low-cost, easily constructed identification card having an antenna and chip incorporated into the body of the card, which protects these electronic components from damage. Applicants' invention relates to a unique structure capable of protecting the IC chip and antenna. Applicants' invention contains two relatively shock-absorbing layers, which may contain indicia. In an embodiment, two rigid outer laminate layers encase the relatively shock-absorbing layers, adding structural support and protection. Applicants' card differs from the prior art in that normally rigid materials are used throughout the card, thus permitting external stresses and bending to damage the delicate IC chip and antenna. In applicants' improved design, rigid outer layers disseminate external forces over a broad area of compliant layers, thus protecting the electronic components.

SUMMARY OF THE INVENTION

The invention provides an identification document and method for making identification document. One aspect of the invention is an identification document comprising a core layer having a first side and a second side; at least one antenna affixed to the first side of the core layer; an anti-binding agent printed on the first side of said core layer and positioned between the antenna and the first side of the core layer; at least one integrated circuit chip electronically connected to the antenna; and a bottom sheet attached to the first side of the core layer such that the antenna and the chip are encased between the core layer and the bottom sheet.

Another aspect of the invention is an identification document comprising a first layer having first and second sides and adapted to absorb at least a portion of a stress applied to the identification document; an antenna disposed adjacent to the first side of the first layer; an integrated circuit chip operably coupled to the antenna; and a second layer having first and second sides and adapted to absorb at least a portion of a stress applied to the identification document, the second side of the second layer being fixedly coupled to the first side of the first layer, the second layer being constructed and arranged to substantially encase the antenna and the integrated circuit chip between the first and second layers.

Another aspect of the invention is an identification document, comprising a first layer having first and second sides and adapted to absorb at least a portion of a stress applied to the identification document; an antenna disposed adjacent to the first side of the first layer; an integrated circuit chip operably coupled to the antenna; a second layer having first and second sides and adapted to absorb at least a portion of a stress applied to the identification document, the second side of the second layer being fixedly coupled to the first side of the first layer, the second layer being constructed and arranged to substantially encase the antenna and the integrated circuit chip between the first and second layers; and a substantially rigid layer coupled to at least one of the second side of the first layer and the first side of the second layer.

Finally, another aspect of the invention is a method of making an identification document, comprising providing a first layer having first and second sides, the first layer comprising a substantially flexible material; applying a release agent to the first side of the first layer; disposing an antenna adjacent to the first side of the first layer; operably coupling an integrated circuit chip to the antenna; and substantially encasing the antenna and the integrated circuit chip between the first side of the first layer and a second layer, the second layer comprising a substantially flexible material and being constructed and arranged to mate with the first layer, antenna, and integrated circuit chip to form an identification document having first and second sides.

Additional features of the invention will become apparent from the following detailed description and accompanying drawings.

DETAILED DESCRIPTION OF THE INVENTION

Figure 1:
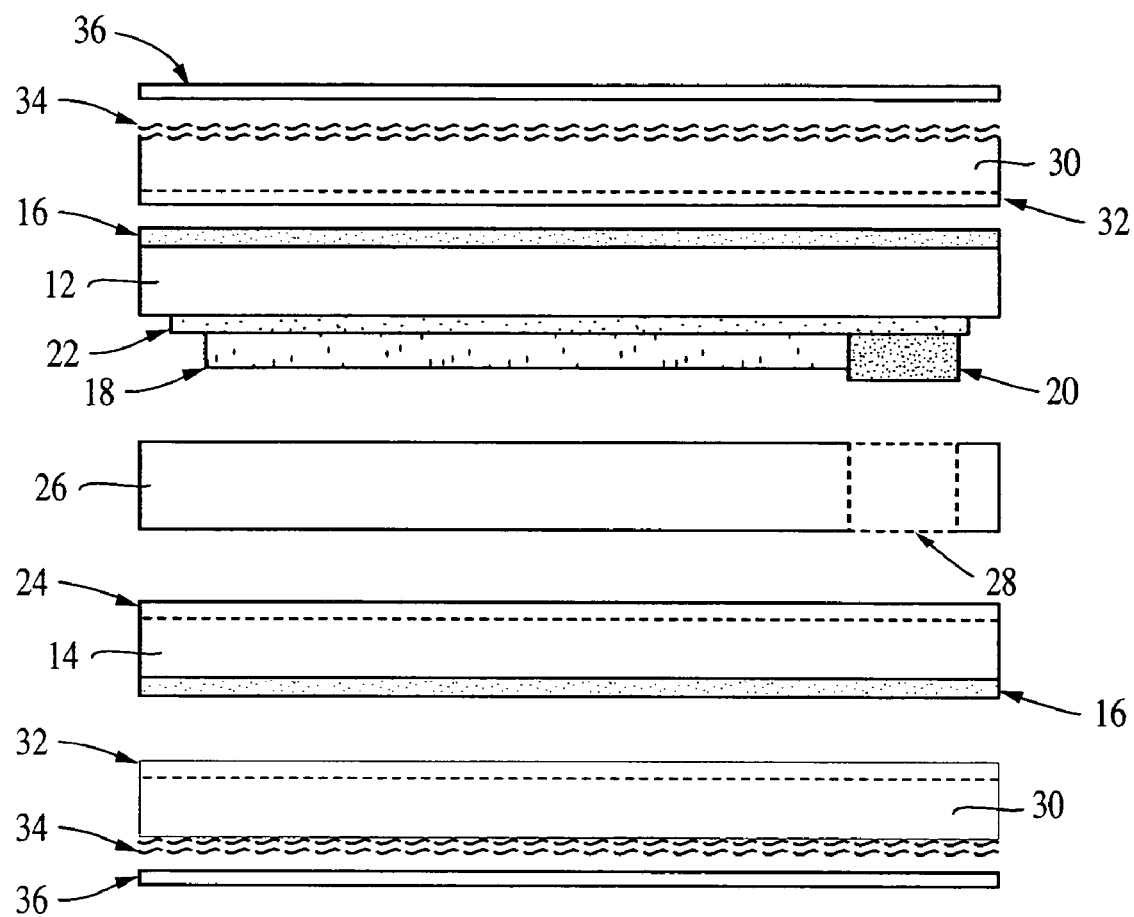
FIG. 1 of the attached drawings shows a cross-section of an identification card of the present invention.

To prepare an identification card of the present invention the first step is pre-shrinking a core layer. In order to provide an identification document having a bright white background and good color rendition, it is generally preferred that the core layer be formed from an opaque sheet of printable silica-filled polyolefin, such as the materials sold commercially by PPG Industries, Inc., Pittsburgh, Pa. under the Registered Trade Mark "TESLIN" sheet.

The first indicium or indicia, which are typically the invariant information common to a large number of identification documents, for example the name and logo of the organization issuing the documents, may be formed by any known process capable of forming the indicium on the specific core material used.

However, since it is usually desired to provide numerous copies of the first indicium on a large area of core layer material (in the form of a large sheet or web) in order to allow the preparation of a large number of "blank" documents at one time, a printing process such as color laser printing, is normally used to apply the first indicium. A modified laser printer useful for forming the first indicium in the present process is described in U.S. Pat. No. 5,579,694.

In order to minimize the risk of damage to the fragile electronic components, preferably alkyd resin spids containing an anti-binding agent are printed onto one side of the shrunken core sheet on the side opposite from the indicia. These spids may be printed in any pattern, however, in an embodiment they are printed onto the core in a "racetrack" or oval pattern. Antennae, typically silver-epoxy antennae, are then printed onto the spids in a matching pattern. Integrated circuit chips are attached to solder bumps on the antennae in the conventional manner.

The core layer with attached antennae and IC chips is then bonded to a bottom sheet of printable, silica-filled polyolefin with an adhesive layer. The adhesive layer may be composed of a number of commercially available adhesives, however, very desirably it is composed of a co-polyester based adhesive such as the adhesive sold commercially by Transilwrap, Inc., Richmond, Ind. under the name Transilwrap® TXP(3). Because IC chips are typically much thicker than the antennae, preferably recesses are cut in the TXP(3) adhesive layer to accommodate the IC chips. By removing a section of the adhesive, the identification card will be of uniform thickness. Because recesses were cut in this TXP(3) adhesive layer, in order to bond the IC chip to the bottom layer, an additional layer of adhesive is required. Although this adhesive may comprise any suitable adhesive, in the preferred embodiment it is a carboxylated polyethylene hot melt adhesive such as that manufactured by Transilwrap, Inc. and sold under the name Transilwrap® KRTY. This adhesive is applied to the bottom layer prior to assembly of the card and serves to bind the IC chip to the bottom layer. During lamination of the identification card, the TXP(3) adhesive layer will flow freely thus adhering the core sheet with the bottom sheet, sandwiching the electronic components in a bonded, flexible laminate of silica-filled polyolefin.

Two layers of substantially transparent polymer are affixed to the bonded core layer/bottom layer structure. Depending upon the material used for the core layer and bottom layer, the process used to produce the first indicium and the type of substantially transparent polymer employed, fixation of the polymer layers to the core layer may be effected by heat and pressure alone. However, it is generally preferred to provide an adhesive layer on each polymer layer to improve its adhesion to the core layer. This adhesive layer may be a polyester, polyester urethane, polyether urethane or polyolefin hot melt or ultraviolet or thermally cured adhesive, and the adhesive may be coated, cast or extruded on to one surface of the polymer sheet. The polymer layers themselves may be formed from any polymer having sufficient transparency, for example polyester, polycarbonate; polystyrene, cellulose ester, polyolefin, polysulfone, or polyimide. Either an amorphous or biaxially oriented polymer may be used. Two specific preferred polyesters for use in the process of the present invention is poly(ethylene terephthalate) (PET), which is readily available commercially, for example from ICI Americas Inc., Wilmington, Del. 19850 under the Registered Trade Mark "MELINEX", and poly (ethylene terephthalate glycol) (PETG), which is readily available commercially from Eastman Kodak Chemical, Kingsport, Tenn. The polymer layers provide mechanical strength to the image-receiving layer or layers and hence to the image(s) in the finished document. The thickness of the polymer layers is not critical, although it is generally preferred that the thickness of each polymer layer (including the thickness of its associated adhesive layer, if any) be at least about 0.1 mm, and desirably is in the range of from about 0.125 to about 0.225 mm. Any conventional lamination process may effect lamination of the polymer layers to the core layer, and such processes are well known to those skilled in the production of identification documents.

The image-receiving layer of the present identification document may be formed of any material capable of receiving an image by dye diffusion thermal transfer. However, very desirably the dye diffusion thermal transfer printing step of the present process is effected by the process of U.S. Pat. No. 5,334,573. This patent describes a receiving sheet or layer which is comprised of a polymer system of which at least one polymer is capable of receiving image-forming materials from a donor sheet with the application of heat, the polymer system of the receiving sheet or layer being incompatible with the polymer of the donor sheet at the receiving sheet/donor sheet interface so that there is no adhesion between the donor sheet and the receiving sheet or layer during printing. In addition, the polymer system of the receiving sheet or layer can be substantially free from release agents, such as silicone-based oils, poly(organosiloxanes), fluorinated polymers, fluorine or phosphate-containing surfactants, fatty acid surfactants and waxes. The present process may employ any of the donor sheet/image-receiving layer combinations described in this patent. Suitable binder materials for the dyes, which are immiscible with the polymer system of the image-receiving layer, include cellulose resins, cellulose acetate butyrate, vinyl resins such as poly(vinyl alcohol), poly(vinylpyrrolidone) poly(vinyl acetate), vinyl alcohol/vinyl butyrate copolymers and polyesters. Polymers which can be used in the image-receiving layer and which are immiscible with the aforementioned donor binders include polyester, polyacrylate, polycarbonate, poly(4-vinylpyridine), poly(vinyl acetate), polystyrene and its copolymers, polyurethane, polyamide, poly(vinyl chloride), polyacrylonitrile, or a polymeric liquid crystal resin. The most common image-receiving layer polymers are polyester, polycaprolactone and poly(vinyl chloride). Processes for forming such image-receiving layers are also described in detail in this patent; in most cases, the polymer(s) used to form the image-receiving layer are dissolved in an organic solvent, such as methyl ethyl ketone, dichloromethane or chloroform, and the resultant solution coated onto the polymer layer using conventional coating apparatus, and the solvent evaporated to form the image-receiving layer. However, if desired the image-receiving layer can be applied to the polymer layer by extrusion casting, or by slot, gravure or other known coating methods.

The identification cards of the present invention may have only a single image-receiving layer, but is generally preferred that they have two image-receiving layers, one such layer being provided on each layer of polyester on the side thereof remote from the core layer. Typically, one or more second indicia intended for human reading may be printed on the image-receiving layer on the front side of the identification document, and one or more additional second indicia intended for machine reading (for example, bar codes) may be printed on the image-receiving layer on the back side.

Following the printing of the second indicia on the image-receiving layer, a protective layer is affixed over at least the portion of the or each image-receiving layer carrying the second indicia; this protective layer serves to protect the relatively fragile image-receiving layer from damage, and also prevents bleeding of the thermal transfer dye from the image-receiving layer. Materials suitable for forming such protective layers are known to those skilled in the art of dye diffusion thermal transfer printing and any of the conventional materials may be used provided they have sufficient transparency and sufficient adhesion to the specific image-receiving layer with which they are in contact and block bleeding of dye from this layer. Typically, the protective layer will be a biaxially oriented polyester or other optically clear durable plastic film.

The protective layer desirably provides additional security features for the identification card. For example, the protective layer may include a low cohesivity polymeric layer, an optically variable ink, an image printed in an ink which is readable in the infra-red or ultraviolet but is invisible in normal white light, an image printed in a fluorescent or phosphorescent ink, or any other available security feature which protects the document against tampering or counterfeiting, and which does not compromise the ability of the protective layer to protect the identification document against wear and the elements.

In an alternate embodiment, the image-receiving layer may be formed from any material capable of receiving ink-jet printing. Many commercially available inkjet receiver coatings will suffice, however it is important that the inkjet receiver coating is only applied in the area where printing will occur, to ensure that the polyester layer will properly adhere to the core layer. The identification card may then be personalized with a common inkjet printer prior to addition of the polyester layers. In this embodiment the personalized information is printed between the core layer and the polyester layers, thus eliminating the need for an additional protective layer.

FIG. 1 of the accompanying drawings shows a schematic cross-section through an embodiment of an identification card of the present invention. The document comprises a core layer 12 and a bottom layer 14, both formed of an opaque white reflective polyolefin (preferably the aforementioned TESLIN® sheet). One side of the core layer and one side of the bottom sheet are printed with fixed indicia 16. Sandwiched between the core layer 12 and the bottom layer 14 are an antenna 18 connected to an integrated circuit chip 20. An alkyd resin spid 22 lies beneath the core layer 12 and the antenna 18. An adhesive layer 24 (preferably KRTY) is applied to the bottom layer 14 on the side facing the core layer 12. The bottom layer 14 and the core layer 12 are joined with an adhesive layer 26 (preferably TXP(3)). Recesses 28 are cut into the adhesive layer 26 to accommodate the integrated circuit chip 20.

The core layer 12 and bottom layer 14 are sandwiched between two polymer layers 30 formed from an amorphous or biaxially oriented polyester or other optically clear plastic such as polycarbonate. Each of these polymer layers 30 is fixedly secured to the core layer 12 and bottom layer 14 by an adhesive layer 32. On the opposed side of each polymer layer 30 from the laminated core layer 12 and bottom layer 14 is provided an image-receiving layer 34 suited to accept a printed image or portrait or other variable indicia by dye diffusion thermal transfer methods.

After the variable indicia have been printed on the image-receiving layers 34, a biaxially oriented polyester or other optically clear durable plastic protective layer 36 is applied to protect the variable indicia and prevent bleeding of dye from the image-receiving layers 34. The protective layer 36 may be provided with a low cohesivity layer, security ink or other security feature.

Figure 2:
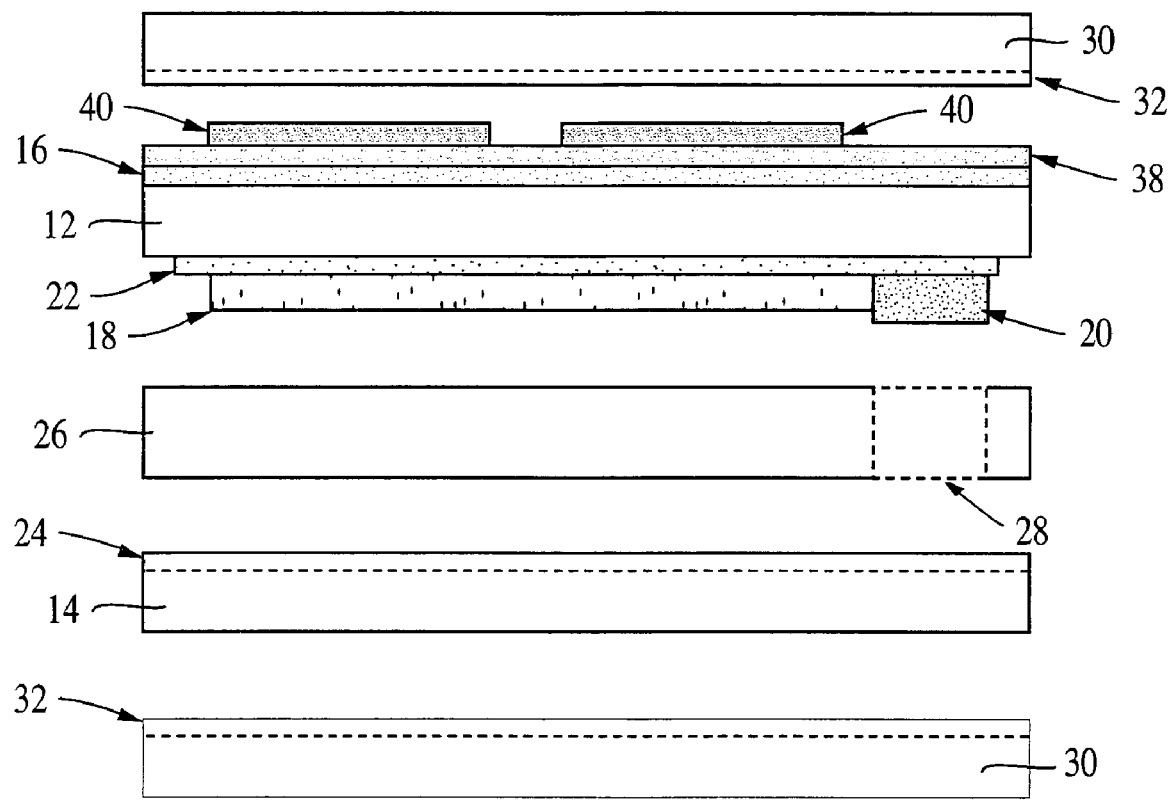
FIG. 2 of the attached drawings shows a cross-section of an alternative embodiment of the present invention.

FIG. 2 of the accompanying drawings shows a schematic cross-section through an alternate embodiment of an identification card of the present invention. The document, generally designated 10, comprises a core layer 12 and a bottom layer 14, both formed of an opaque white reflective polyolefin (preferably the aforementioned TESLIN® sheet). Opposed sides of the core layer and the bottom sheet are printed with fixed indicia 16. Sandwiched between the core layer 12 and the bottom layer 14 is an antenna 18 connected to an integrated circuit chip 20. An alkyd resin spid 22 lies beneath the core layer 12 and the antenna 18. An adhesive layer 24 (preferably KRTY) is applied to the bottom layer 14 on the side facing the core layer 12. The bottom layer 14 and the core layer 12 are joined with an adhesive layer 26 (preferably TXP(3)). Recesses 28 are cut into the adhesive layer 26 to accommodate the integrated circuit chip 20.

The laminated core layer 12 and bottom layer 14 is sandwiched between two polymer layers 30 formed from an amorphous or biaxially oriented polyester or other optically clear plastic such as polycarbonate. An inkjet receiver coating 38 is supplied between the core layer 12 and a polymer layer 30. The inkjet receiver coating 38 may contain personalized data 40 Each of the polymer layers 30 is fixedly secured to the core layer 12 and bottom layer 14 by a layer 32 of adhesive.

The following Examples are now given, though by way of illustration only, to show details of specific preferred reagents, conditions and techniques used to prepare identification cards of the present invention.

EXAMPLE 1

Core layers of silica-filled polyolefin were prepared, preferably of the aforementioned TESLIN®, of 0.01" thickness in the size of four A4 sheets (210 mm×297 mm×4 mm). The core layers were heated at 105° C. for approximately 30 minutes to pre-shrink the material. Alkyd resin spids, in a racetrack design, were then printed on the bottom side of the shrunken core layers, and background artwork was printed on a side of the core layers. Silver-epoxy antennae were then screen-printed onto the spidded areas of the sheets, and IC chips were then attached to the antennae. Because the core layers were heated repeatedly during this process, it is important that the polyloefin be pre-shrunk to avoid any shrinking problems during printing of the artwork or attachment of the electronic components.

Bottom layers were prepared by pre-shrinking 10 mm thick silica-filled polyolefin sheet in the manner described above. Artwork was printed onto a side of the bottom layer. 1.5 mm of an adhesive, preferably KRTY, was applied to an opposed side of the bottom layers to adhere the IC chip to the bottom layer.

The core layers and the bottom layers were joined by a free film of adhesive (7 mm of TXP (3)) cut into A4 sized sheets. Holes were precut in the TXP(3) adhesive sheets to accommodate the IC chips. The core layers and bottom layers were then joined by the TXP(3) adhesive layer such that the antennae and chips were sandwiched between them, thus encasing and protecting the electronic components. The core layers and bottom layers were joined (up to 10 at a time) using a Tetrahedron press. Initially, the pressure used was very low (of less than approximately 400 psi) and the temperature was relatively high (approximately 290° F.) so that the TXP(3) adhesive layer was allowed to flow and so that the electronic components are not damaged. Pressure and temperature were then increased to approximately 3 ksi and 300° F. to bond the three layers together. The temperature was then lowered to approximately 170° F. while the pressure remained relatively high (approximately 2 ksi) so that the TXP(3) adhesive layer would solidify without altering the form of the pressed core layer. Pressure was then reduced and the press was opened, yielding a core layer/bottom layer laminate encasing the electronic components.

This core layer/bottom layer was then laminated using a nip-roll lamination process. The top laminate material used was a 7/3 TXP (5)/KRTY onto which a dye diffusion thermal transfer receiver coating had been applied to the adhesive side. The bottom laminate was a 7/3 TXP (5)/KRTY layer. The resulting card was then imprinted with personal information on both the front and back using an Atlantek printer. Security features, such as UV sensitive inks or Polasecure®, can be added to the top surface of the card. After this, a 0.001" thick bi-axial polyester laminate was applied to both sides of the identification card.

EXAMPLE 2

The core layer/bottom layer was prepared as described in Example 1. For personalization, however, an inkjet receiver coating, preferably a Grace-Davison formulation, was patch-coated onto selective areas of the core layer opposite the bottom layer. It is important that the entire core layer was not coated with the receiver coating or the core would not properly adhere to the polyester laminate. Image and text were printed onto the receiving layer using a Canon® 8200 printer and pigment-based inks. The printed cores were then belt laminated on both sides using 7/3 TXP (0)/KRTY as both the top and bottom laminate.

From the foregoing, it will be seen that the present invention provides an identification card which affords significant improvements in durability (by protecting the integrated circuit chip and antenna) and ease of manufacture as compared with the prior art identification cards and smart cards described above. It is to be understood that the above-described embodiments are merely illustrative of the present invention and represent a limited number of the possible specific embodiments that can provide applications of the principles of the invention. Numerous and varied other arrangements may be readily devised in accordance with these principles by those skilled in the art without departing from the spirit and scope of the invention as claimed.

We claim:

1. An identification document comprising:
a core layer, the core layer having a first side and a second side;
at least one antenna affixed to the first side of the core layer;
an anti-binding agent printed on the first side of said core layer and positioned between the antenna and the first side of the core layer;
at least one integrated circuit chip electronically connected to the antenna; and
a bottom sheet attached to the first side of the core layer such that the antenna and the chip are encased between the core layer and the bottom sheet.

2. The identification document of claim 1 wherein the core layer comprises at least one of polyolefin, TESLIN, silica-filled polyolefin, reflective polyolefin, white polyolefin, and opaque polyolefin.

3. The identification document of claim 1, wherein the core layer is pre-shrunk prior to at least one of affixing the antenna, printing the anti-binding agent, electronically connecting the antenna, and attaching the bottom sheet.

4. The identification document of claim 1, further comprising an image receiving layer affixed to at least one of the second side of the core layer and the first side of the bottom sheet.

5. The identification document of claim 4 further comprising a first polymer layer constructed and arranged to add mechanical strength to the image receiving layer.

6. The identification document of claim 5, wherein the first polymer layer comprises at least one of a polymer, polycarbonate, polyester, polystyrene, cellulose ester, polyolefin, polysulfone, polyamide, poly(ethylene terephthalate), and (ethylene terephthalate glycol).

7. The identification document of claim 4, wherein the image receiving layer comprises at least one of a material capable of receiving an image by dye diffusion thermal transfer and a material capable of receiving an image by ink jet printing.

8. The identification document of claim 4, further comprising at least one indicium printed on the image-receiving layer.

9. The identification document of claim 8, wherein the indicium is printed using at least one of dye diffusion thermal transfer and ink jet printing.

10. The identification document of claim 1 wherein the anti-binding agent comprises a polyester epoxy material containing a release agent.

11. The identification document of claim 1 wherein the anti-binding agent comprises an acrylate epoxy material containing a release agent.

12. The identification document of claim 1 wherein the anti-binding agent comprises a vinyl acetate epoxy material containing a release agent.

13. The identification document of claim 1, wherein the anti-binding agent comprises an alkyd resin spid.

14. The identification document of claim 1 further comprising a first adhesive layer attaching the bottom sheet to the first side of the core, wherein at least one of the core, bottom sheet, and the first adhesive layer is constructed and arranged so that the identification card has a substantially uniform thickness.

15. The identification document of claim 14, wherein the first adhesive layer includes a recess sized to accommodate the integrated circuit chip.

16. An identification document, comprising:
a first layer having first and second sides and adapted to absorb at least a portion of a stress applied to the identification document;
an antenna disposed adjacent to the first side of the first layer;
an integrated circuit chip operably coupled to the antenna; and
a second layer having first and second sides and adapted to absorb at least a portion of a stress applied to the identification document, the second side of the second layer being fixedly coupled to the first side of the first layer, the second layer being constructed and arranged to substantially encase the antenna and the integrated circuit chip between the first and second layers.

17. The identification document of claim 16, further comprising a substantially rigid layer coupled to at least one of the second side of the first layer and the first side of the second layer.

18. The identification document of claim 17, further comprising an image-receiving layer coupled to the substantially rigid layer, the image-receiving layer comprising at least one of a material capable of receiving an image by dye diffusion thermal transfer and a material capable of receiving an image by ink jet printing.

19. An identification document, comprising:
a first layer having first and second sides and adapted to absorb at least a portion of a stress applied to the identification document;
an antenna disposed adjacent to the first side of the first layer;
an integrated circuit chip operably coupled to the antenna;
a second layer having first and second sides and adapted to absorb at least a portion of a stress applied to the identification document, the second side of the second layer being fixedly coupled to the first side of the first layer, the second layer being constructed and arranged to substantially encase the antenna and the integrated circuit chip between the first and second layers; and
a substantially rigid layer coupled to at least one of the second side of the first layer and the first side of the second layer.

20. The identification document of claim 19, further comprising an image-receiving layer coupled to the substantially rigid layer, the image-receiving layer comprising at least one of a material capable of receiving an image by dye diffusion thermal transfer and a material capable of receiving an image by ink jet printing.

21. A method of making an identification document, comprising:
providing a first layer having first and second sides, the first layer comprising a substantially flexible material;
disposing an antenna adjacent to the first side of the first layer;
operably coupling an integrated circuit chip to the antenna; and
substantially encasing the antenna and the integrated circuit chip between the first side of the first layer and a second layer, the second layer comprising a substantially flexible material and being constructed and arranged to mate with the first layer, antenna, and integrated circuit chip to form an identification document having first and second sides.

22. The method of claim 21 including attaching a substantially rigid layer to at least one of the first and second layers.

23. The method of claim 21 further comprising applying an image-receiving layer to the identification document, the image-receiving layer comprising at least one of a material capable of receiving an image by dye diffusion thermal transfer and a material capable of receiving an image by ink jet printing.

24. The method of claim 23 further comprising forming at least one of a variable and a fixed indicium on the image-receiving layer.

25. The method of claim 21 further comprising forming at least one of a variable and a fixed indicium on at least one of the first and second sides of the identification document.

26. The method of claim 21 further including:
applying a release agent to the first side of the first layer.

* * * * *